(12) United States Patent
Zhou et al.

(10) Patent No.: US 9,244,547 B2
(45) Date of Patent: Jan. 26, 2016

(54) DISPLAY PANEL FOR THE BLIND AND METHOD FOR MANUFACTURING THE SAME AND DISPLAY DEVICE FOR THE BLIND

(75) Inventors: Weifeng Zhou, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 339 days.

(21) Appl. No.: 13/702,111

(22) PCT Filed: Aug. 30, 2012

(86) PCT No.: PCT/CN2012/080796
§ 371 (c)(1),
(2), (4) Date: Dec. 5, 2012

(87) PCT Pub. No.: WO2013/029554
PCT Pub. Date: Mar. 7, 2013

(65) Prior Publication Data
US 2013/0147737 A1 Jun. 13, 2013

(30) Foreign Application Priority Data
Aug. 30, 2011 (CN) .......................... 2011 1 0253616

(51) Int. Cl.
*G06F 3/041* (2006.01)
*G09B 21/00* (2006.01)
*H01L 33/52* (2010.01)

(52) U.S. Cl.
CPC .............. *G06F 3/041* (2013.01); *G09B 21/004* (2013.01); *H01L 33/52* (2013.01)

(58) Field of Classification Search
None
See application file for complete search history.

(56) References Cited

U.S. PATENT DOCUMENTS 6,323,846 B1 * 11/2001 Westerman et al. .......... 345/173
2005/0052592 A1 3/2005 Fukuhara
(Continued)

FOREIGN PATENT DOCUMENTS

| CN | 1580920 A | 2/2005 |
| CN | 1763976 A | 4/2006 |

(Continued)

OTHER PUBLICATIONS

International Preliminary Report on Patentability dated Mar. 4, 2014; PCT/CN2012/080796.
(Continued)

*Primary Examiner* — David D Davis
(74) *Attorney, Agent, or Firm* — Ladas & Parry LLP

(57) ABSTRACT

Embodiments of the present invention include a display panel for the blind, a method for manufacturing the same and a display device for the blind. The display panel for the blind includes an array substrate, a touch substrate and an elastic film. The array substrate includes a glass substrate and data lines and gate lines formed on the glass substrate. The data lines and gate lines intersect each other so as to form pixel units, with each of the pixel units including a pixel electrode. The touch substrate includes a flexible film layer and charged columnar structures provided on the flexible film layer. The elastic film layer is provided between the array substrate and the touch substrate. The side of the touch substrate on which the charged columnar structures are formed faces the side of the array substrate on which the pixel electrodes are formed, and the charged columnar structures on the touch substrate correspond to the pixel electrodes on the array substrate one to one.

12 Claims, 3 Drawing Sheets

(56) References Cited

U.S. PATENT DOCUMENTS

| | | |
|---|---|---|
| 2007/0002264 A1 | 1/2007 | Kim |
| 2008/0110390 A1 | 5/2008 | Peterson |
| 2008/0138774 A1 | 6/2008 | Ahn et al. |
| 2009/0104725 A1 | 4/2009 | Paik et al. |
| 2010/0033448 A1 | 2/2010 | Koito et al. |
| 2010/0097323 A1* | 4/2010 | Edwards et al. ............. 345/173 |
| 2010/0225596 A1 | 9/2010 | Eldering |
| 2011/0012828 A1 | 1/2011 | Nagai et al. |
| 2012/0062516 A1 | 3/2012 | Chen et al. |

FOREIGN PATENT DOCUMENTS

| | | |
|---|---|---|
| CN | 1892366 A | 1/2007 |
| CN | 101183498 A | 5/2008 |
| CN | 101644841 A | 2/2010 |
| CN | 101825967 A | 9/2010 |
| CN | 101907922 A | 12/2010 |
| CN | 101958066 A | 1/2011 |
| JP | 2007-052368 A | 3/2007 |
| JP | 2009-031515 A | 2/2009 |
| JP | 2009-295725 A | 12/2009 |
| JP | 2011-095903 A | 5/2011 |

OTHER PUBLICATIONS

Second Chinese Office Action dated Nov. 18, 2013; Appln. No. 201110253616.6.

International Search Report dated Aug. 30, 2011 PCT/CN2012/080796.

First Chinese Office Action dated Jun. 9, 2013; Appln. No. 2011102536166.

* cited by examiner understand# DISPLAY PANEL FOR THE BLIND AND METHOD FOR MANUFACTURING THE SAME AND DISPLAY DEVICE FOR THE BLIND

TECHNICAL FIELD

Embodiments of the present invention relate to a display panel for the blind and a method for manufacturing the same, and a display device for the blind.

BACKGROUND

As electronic books have been developed and information technology has been enhanced, the conventional books printed in braille can not keep pace with reading requirements of blind persons gradually in terms of the kind and the number. In the prior art, a common display device can only be provided for being used by a user with normal vision, and a person with visual disability can not use the display device due to the obstacle in his or her body.

Currently, there is an urgent need for a display device for the blind which can be provided for being used by blind persons, so as to allow blind persons to read electronic books by using the display device for the blind.

SUMMARY

An embodiment of the present invention provides a display panel for the blind comprising an array substrate, a touch substrate and an elastic film. The array substrate includes a glass substrate and data lines and gate lines formed on the glass substrate. The data lines and gate lines intersect each other so as to form pixel units, with each of the pixel units including a pixel electrode. The touch substrate includes a flexible film layer and charged columnar structures provided on the flexible film layer. The elastic film layer is provided between the array substrate and the touch substrate. The side of the touch substrate on which the charged columnar structures are formed faces the side of the array substrate on which the pixel electrodes are formed, and the charged columnar structures on the touch substrate correspond to the pixel electrodes on the array substrate one to one.

Another embodiment of the present invention provides a display device for the blind, which comprises the above display panel for the blind.

Another embodiment of the present invention provides a method of manufacturing a display panel for the blind. The method includes the step of forming data lines and gate lines on a transparent substrate, with the data lines and gate lines intersecting each other to form pixel units, and with each of the pixel units including a pixel electrode, so as to form an array substrate. The method also includes depositing a spacer layer on a flexible film layer, and performing a patterning process on the spacer layer to form charged columnar structures, so as to form a touch substrate. Finally, the method includes bonding the array substrate and the touch substrate. In the method an elastic film layer is provided between the array substrate and the touch substrate, the side of the touch substrate on which the charged columnar structures are formed faces the side of the array substrate on which the pixel electrodes are formed, and the charged columnar structures on the touched substrate correspond to the pixel electrode on the array substrate one to one.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide a display panel for the blind and a display device for the blind which includes the display panel for the blind, so as to allow blind persons to read electronic books by touching. Embodiments of the invention also provide a method for manufacturing the display panel for the blind.

Figure 1:
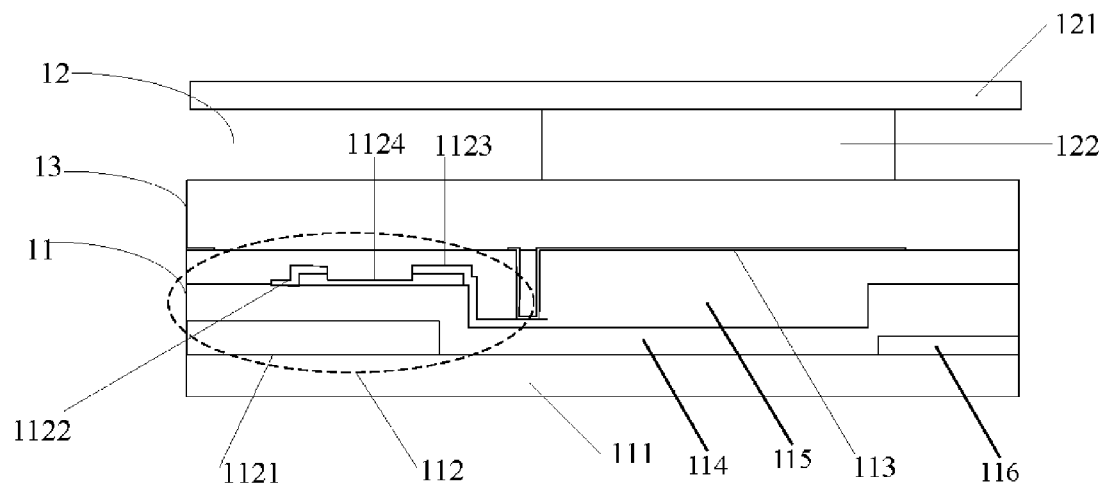
FIG. 1 is a structurally schematic view illustrating a display panel for the blind provided by an embodiment of the invention.

Hereinafter, a display panel for the blind provided by an embodiment of the invention will be described with referent to FIG. 1. FIG. 1 is a structurally schematic view illustrating the display panel for the blind provided by the embodiment of the invention. As shown in FIG. 1, the display panel for the blind provided by the embodiment of the invention comprises an array substrate 11, a touch substrate 12 and an elastic film layer 13 provided between the array substrate 11 and the touch substrate 12.

In this embodiment, the array substrate 11 comprises a glass substrate 111, on which a plurality of data lines (not shown) and a plurality of gate lines 116 are formed, and the data lines and the gate lines 116 intersect each other so as to form a plurality of pixel units. Each of the pixel units includes a thin film transistor 112 and a pixel electrode 113. The thin film transistor 112 functions as a switch element of the pixel unit, and includes a gate electrode 1121, a source electrode 1122, a drain electrode 1123 and an active-layer pattern 1124. The thin film transistor is an example of active switch elements; and in another embodiment of the invention, the thin film transistor may be replaced with other active switch element. Alternatively, a passive switch structure may be used in a pixel unit of an array substrate according to an embodiment of the invention. The gate electrode 1121 can be connected to the gate line 116 or can be integrally formed with the gate line 116. An insulating layer 114 is formed between the gate electrode 1121 and the active-layer pattern 1124. A passivation layer 115 covers the thin film transistor 112, and a through hole for exposing the drain electrode 1123 of the thin film transistor 112 is formed in the passivation layer 115. The pixel electrode 113 is electrically connected to the drain electrode 1123 via the through hole. In other embodiments of the invention, the glass substrate 111 may also be replaced by a quartz substrate, a plastic substrate or other transparent substrate.

In this embodiment, the touch substrate 12 includes a flexible film layer 121 and charged columnar structures 122 provided on the flexible film layer 121. A side of the touch substrate 12 on which the charged columnar structures 122 are formed faces a side of the array substrate 11 on which the pixel electrodes 113 are formed, and the charged columnar structures 122 on the touch substrate 12 correspond to the pixel electrodes 113 on the array substrate 11 one to one.

In this embodiment, the elastic film layer 13 may be formed of a film-layer material which has a restorable function such as rubber, resin or the like, and the flexible film layer 121 is of a film-layer material which has a curved function.

As stated above, the display panel for the blind provided by the embodiment of the invention comprises the array substrate and the touch substrate provided on the array substrate, and thus, after the pixel electrode on the array substrate is powered on, a Coulomb force is generated between the charged columnar structure in the touch substrate and the pixel electrode in the array substrate on the basis of the Coulomb force principle. Under the action of the Coulomb force, the flexible film layer in the touch substrate is deformed so that a surface of the touch substrate becomes uneven to form corresponding braille, and in turn, blind persons are allowed to read by touching the display device for the blind. After the pixel electrode on the array substrate is powered off in a state of being powered on, the deformed flexible film layer is restored by the elastic film layer to a non-deformation state (an initial state), and then, a region on the touch substrate corresponding to the powered-off pixel electrode is restored to a state where the pixel electrode is not powered on. In this way, an object that blind persons are allowed to read by touching a display panel for the blind is achieved by the display panel for the blind provided by the invention, and a problem in prior art that the blind persons cannot read electronic books is solved.

Figure 2:
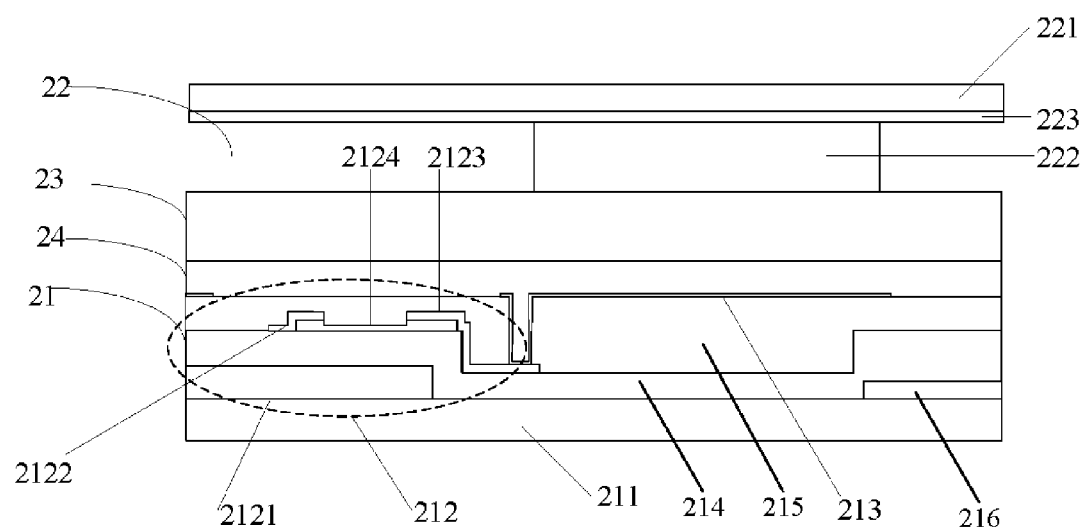
FIG. 2 is a structurally schematic view illustrating a display panel for the blind provided by another embodiment of the invention.

Hereinafter, a display panel for the blind provided by another embodiment of the invention will be described with reference to FIG. 2. FIG. 2 is a structurally schematic view illustrating the display panel for the blind provided by another embodiment of the invention. As shown in FIG. 2, the display panel for the blind provided by the another embodiment of the invention includes an array substrate 21, a touch substrate 22 and an elastic film layer 23 provided between the array substrate 21 and the touch substrate 22.

In this embodiment, the array substrate 21 comprises a glass substrate 211, on which a plurality of data lines (not shown) and a plurality of gate lines 216 are formed; and the data lines and the gate lines 216 intersect each other so as to form a plurality of pixel units. Each of the pixel units includes a thin film transistor 212 and a pixel electrode 213, wherein, the thin film transistor 212 includes a gate electrode 2121, a source electrode 2122, a drain electrode 2123 and an active layer pattern 2124. The gate electrode 2131 can be connected to the gate line 216 or can be integrally formed with the gate line 216. An insulating layer 214 is formed between the gate electrode 2121 and the active layer pattern 2124. A passivation layer 215 covers the thin film transistor 212, and a through hole for exposing the drain electrode 2123 of the thin film transistor 212 is formed in the passivation layer 215. The pixel electrode 213 is electrically connected to the drain electrode 2123 via the through hole. In other embodiments of the invention, the glass substrate 211 may also be replaced by a quartz substrate, a plastic substrate or other transparent substrate.

In this embodiment, the touch substrate 22 comprises a flexible film layer 221 and charged columnar structures 222 provided on the flexible film layer 221. A side of the touch substrate 12 on which the charged columnar structures 122 are formed faces a side of the array substrate 21 on which the pixel electrodes 213 are formed, and the charged columnar structures 222 on the touch substrate 22 correspond to the pixel electrodes 213 on the array substrate 21 one to one.

In this embodiment, the elastic film layer 23 may be formed of a film-layer material which has a restorable function such as rubber, resin or the like, and the flexible film layer 221 is of a film-layer material which has a curved function.

As stated above, the display panel for the blind provided by the embodiment of the invention comprises the array substrate and the touch substrate provided on the array substrate, and thus, after the pixel electrode on the array substrate is powered on, a Coulomb force is generated between the charged columnar structure in the touch substrate and the pixel electrode in the array substrate on the basis of the Coulomb force principle. Under the action of the Coulomb force, the flexible film layer in the touch substrate is deformed so that a surface of the touch substrate becomes uneven to form corresponding braille, and in turn, blind persons are allowed to read by touching the display device for the blind. After the pixel electrode on the array substrate is powered off in a state of being powered on, the deformed flexible film layer is restored by the elastic film layer to a non-deformation state, and then, a region on the touch substrate corresponding to the powered-off pixel electrode is restored to a state where the pixel electrode is not powered on. In this way, an object that blind persons are allowed to read by touching a display panel for the blind is achieved by the display panel for the blind provided by another embodiment of the invention, and a problem in prior art that the blind persons can not read electronic books is solved.

In this embodiment, for purposed of disposing the elastic film layer 23 between the array substrate 21 and the touch substrate 22, the elastic film layer 23 is formed on the array substrate 21 and then the array substrate 21 and the touch substrate 22 are bonded together.

In other embodiments of the invention, optionally, before the array substrate 21 and the touch substrate 22 are bonded, for purposed of disposing the elastic film layer 23 between the array substrate 21 and the touch substrate 22, the elastic film layer 23 is displaced on the array substrate 21 and then the array substrate 21 and the touch substrate 22 are bonded together.

In this embodiment, further, in order to assure flatness of the array substrate 21, a planarizing layer 24 for a planarization function is also formed on the array substrate 21, and the planarizing layer 24 is provided between the array substrate 21 and the elastic film layer 23. In such a way, the bonding of the display panel for the blind can be realized only by performing simple operations on the array substrate in prior art.

In this embodiment, further, in order to make sure that concave and convex portions of the touch substrate 22 has a uniform height when the touch substrate 22 is deformed, the touch substrate 22 further includes a flexible conductive film layer 223, and the flexible conductive film layer 223 is provided between the flexible film layer 221 and the charged columnar structures 222. As such, it is possible to shield an external electric field, so that the touch substrate 22 is deformed only depending on a voltage applied to the pixel electrodes 213 on the array substrate 21.

By way of making a simple introduction to the Coulomb force principle, a principle that characters, images and so on can be displayed for blind persons in a concave-convex form by display panels for the blind, which are provided by embodiments of the invention, will be further explained below.

According to Coulomb's law, a value of an interacting force between two still point charges q1 and q2 is directly proportional to the product of q1 and q2, and is inversely proportional to the square of a distance r therebetween, a direction of the force is oriented along a connecting line therebetween, charges of the same sign repel each other, and charges of opposite signs attract each other. Therefore, for two still charged bodies, their Coulomb force can be expressed by the following equation (1):

$$F1 = kQ1Q2/r^2, k=8.9880\times 10^9 \quad (1)$$

Wherein Q1 and Q2 are charge amounts of the two charged bodies respectively, r is a distance between the two charged bodies, k is a constant, and F1 is an interacting force between the still charged bodies. A charged body may be regarded as being constituted by many point charges, and an interacting force between each pair of still point charges is determined by the Coulomb's law.

Based on the Coulomb force principle, when a voltage which has a same polarity as that of the charged columnar structure is applied to the pixel electrode of the array substrate, a region in the flexible film layer on the touch substrate, which corresponds to the pixel electrode, is deformed in a convex way, and when a voltage which has a polarity opposite to the charged columnar structure is applied to the pixel electrode of the array substrate, a region in the flexible film layer on the touch substrate, which corresponds to the pixel electrode, is deformed in a concave way. Therefore, in embodiments of the invention, the convex and concave deformations of the touch substrate are realized by means of controlling a voltage applied to the pixel electrode on the array substrate, so that blind persons can acquire corresponding information such as characters, images and so on by touching the display panel for the blind.

Embodiments of the invention also provide a display device for the blind comprising the display panel for the blind as shown in FIG. 1 or FIG. 2, specific structure of which is the same as that in the above embodiments, and details for which are omitted here.

The display device for the blind provided by the embodiments of the invention comprises the display panel for the blind comprising the array substrate and the touch substrate provided on the array substrate, and thus, after the pixel electrode on the array substrate is powered on, a Coulomb force is generated between the charged columnar structure in the touch substrate and the pixel electrode in the array substrate on the basis of the Coulomb force principle. Under the action of the Coulomb force, the flexible film layer in the touch substrate is deformed so that a surface of the touch substrate becomes uneven to form corresponding braille, and in turn, blind persons are allowed to read by touching the display device for the blind. After the pixel electrode on the array substrate is powered off in a state of being powered on, the deformed flexible film layer is restored by the elastic film layer to a non-deformation state, and then, a region on the touch substrate corresponding to the powered-off pixel electrode is restored to a state where the pixel electrode is not powered on. In this way, an object that blind persons are allowed to read by touching a display panel for the blind is achieved by the display device for the blind provided by the embodiments of the invention, and a problem in prior art that the blind persons can not read electronic books is solved.

Figure 3:
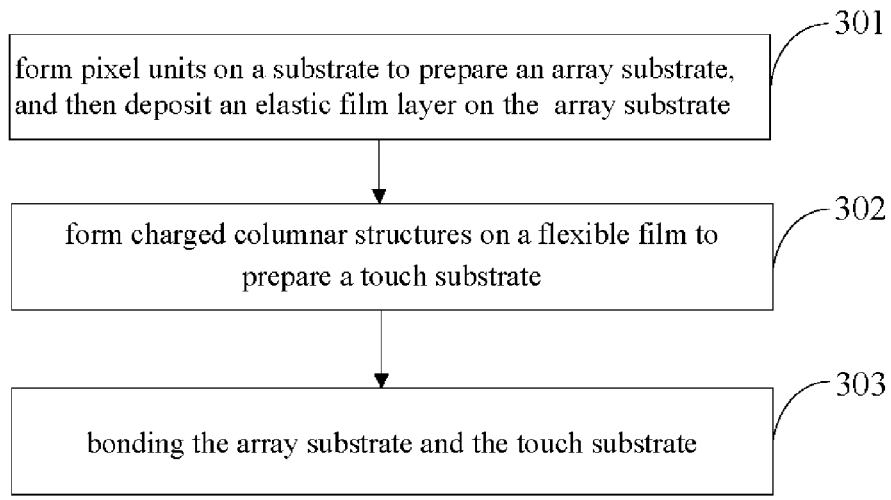
FIG. 3 is a flowchart illustrating a method for manufacturing a display panel for the blind provided by an embodiment of the invention.
Figure 4:
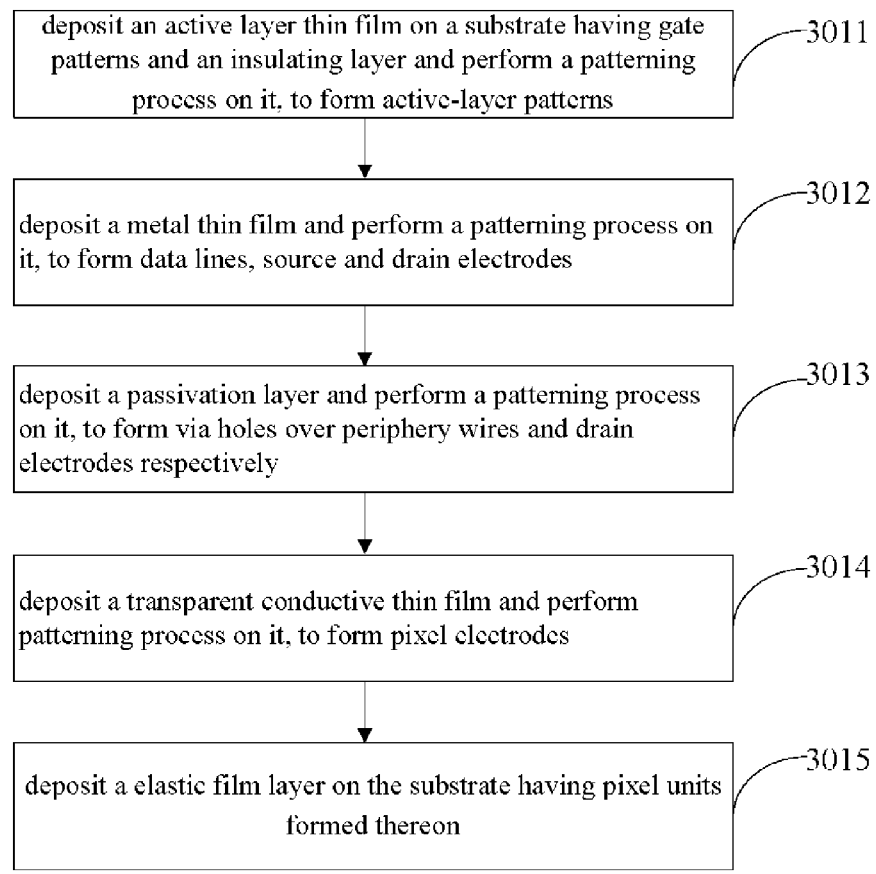
FIG. 4 is a flowchart illustrating a step 301 in the method for manufacturing the display panel for the blind shown in FIG. 3.

In the following, a method for manufacturing a display panel for the blind provided by embodiments of the invention will be described with reference to FIG. 3 and FIG. 4. FIG. 3 is a flowchart illustrating the method for manufacturing the display panel for the blind provided by the embodiments of the invention, and FIG. 4 is a flowchart illustrating a step 301 in the method for manufacturing the display panel for the blind shown in FIG. 3. As shown in FIG. 3, the method for manufacturing the display panel for the blind provided by the embodiment of the invention comprises the following steps.

Step 301, a plurality of data lines and a plurality of gate lines are formed on a glass substrate, the data lines and the gate lines intersect each other to form a plurality of pixel units, each of the pixel units may include a thin film transistor and a pixel electrode, to thereby form an array substrate; and then an elastic film layer is formed (for example, deposited) on the array substrate.

Step 302, a spacer layer is formed (for example, deposited) on a flexible film, and is subjected to a patterning process to form charged columnar structures, so that a touch substrate is formed. In this embodiment, for example, the spacer layer is faulted of a resin material in which charged grains are uniformly distributed.

Step 303, the array substrate and the touch substrate are bonded, so that the elastic film layer is disposed between the array substrate and the touch substrate, a side of the touch substrate on which the charged columnar structures are formed faces a side of the array substrate on which the pixel electrodes are formed, and the charged columnar structures on the touch substrate corresponds to the pixel electrodes on the array substrate one to one.

The step 301 will be further described in detail below with reference to FIG. 4. As shown in FIG. 4, one example of the step 301 includes the following steps.

Step 3011, an active layer thin film is deposited on a substrate (e.g. a glass substrate) on which a gate pattern and an insulating layer are formed, and is subjected to a patterning process, so as to form an active layer pattern.

In the step 3011, firstly, a substrate having gate patterns (including gate electrodes and gate lines) formed thereon is prepared, and then an insulating layer thin film and an active layer thin film can be deposited sequentially on the substrate having the gate patterns formed thereon by way of, such as chemical vapor deposition. The thickness of the insulating layer thin film is, for example, between 1000 Å and 6000 Å, and the thickness of the active layer thin film is, for example, between 1000 Å and 6000 Å. Material for the insulating layer thin film is usually silicon nitride, and silicon oxide, silicon oxynitride or the like may also be used. The active layer thin film usually is formed by using an amorphous silicon thin film, and may also be formed by using a polysilicon thin film, etc.

Next, for example, a photoresist mask is formed on the active layer thin film by a photolithography process, and then the active layer thin film is etched (e.g. dry-etched), so as to form an active layer pattern. During the etching, the insulating layer thin film between the gate patterns and the active layer thin film functions as an etch stop layer.

In the step 3011, the preparation of the substrate having the gate patterns formed thereon can include: a layer of gate metal thin film is formed (e.g. deposited) on a glass substrate and is subjected to a patterning process, so as to form the gate patterns, comprising gate lines and gate electrodes connected thereto, on a certain area of the glass substrate.

In the embodiments of the invention, the layer of gate metal thin film can be deposited on the glass substrate by using, for example, a magnetron-controlled sputtering method, and the thickness of the gate metal thin film is, for example, between 1000 Å and 7000 Å. A metal or alloy such as Molybdenum, aluminum, aluminum-nickel alloy, molybdenum-tungsten alloy, chromium, copper, or the like is usually used as material for the gate metal thin film, and a combination structure of thin films of the above materials may also be used.

Step 3012, a layer of metal thin film is formed (e.g. deposited) on the substrate having the gate patterns, the insulating layer and the active layer patterns formed thereon, and is subjected to a patterning process, so as to form data lines, source electrodes and drain electrodes.

In the step 3012, a metal thin film is deposited, for example, by means of sputtering or thermal evaporation. The thickness of the metal thin film is such as between 1000 Å and 7000 Å. A metal or alloy such as Molybdenum, aluminum, aluminum-nickel alloy, molybdenum-tungsten alloy, chromium, copper or the like is usually used as material for the metal thin film, and a combination structure of thin films of the above materials may also be used. Then, a patterning process is performed on the metal thin film, so as to form the data lines, the source electrodes and the drain electrodes.

Step 3013, a passivation layer is formed (e.g. deposited) on the substrate and is subjected to a patterning process, so as to form via holes for periphery wires and form via holes over the drain electrodes.

In the step 3013, a passivation layer can be deposited, for example, by chemical vapor deposition. The thickness of the passivation layer is such as between 1000 Å and 6000 Å; and the material for the passivation layer is such as silicon nitride, silicon oxide or silicon oxynitride, and can be a single layer or multilayer. The gate electrode is covered by the insulating layer and the passivation layer after the passivation layer is deposited on the substrate, and the via holes for periphery wires and the via holes over the drain electrodes are formed through a patterning process.

Step 3014, a layer of transparent conductive thin film is formed (e.g. deposited) on the substrate and is subjected to a patterning process, so as to form pixel electrodes.

In the step 3014, a transparent conductive thin film can be deposited, for example, by sputtering or thermal evaporation. The material for the transparent conductive thin film may be Indium Tin Oxide (ITO), Indium Zinc Oxide (IZO) or other transparent conductive material. Then, the transparent conductive thin film is patterned through a patterning process, so as to faun pixel electrodes.

Step 3015, an elastic film layer is formed (e.g. deposited) on the substrate having pixel units formed thereon.

In the step 3015, an elastic film layer can be deposited, for example, by spin-coating. In this embodiment, the elastic film layer 23 may be formed of a film-layer material having a restorable function such as rubber, resin, etc.

In the method for manufacturing the display panel for the blind provided by the embodiments of the invention, in order to make sure that the touch substrate is deformed only depending on a voltage applied to the pixel electrodes on the array substrate after the touch substrate and the array substrate are bonded together, prior to the deposition of the spacer layer on the flexible film layer, the method can further include: a flexible conductive film layer is deposited on the flexible film layer, and as such, it is possible to shield an external electric field.

In the method provided by the embodiments of the invention, in order to assure flatness of the array substrate, before the elastic film layer is deposited on the array substrate, the method can further include: a planarizing layer for a planarization function is deposited on the glass substrate having the pixel units formed thereon.

According to the method of manufacturing the display panel for the blind provided by the embodiment of the invention, the manufactured display panel for the blind comprises the array substrate and the touch substrate provided on the array substrate, and thus, after the pixel electrode on the array substrate is powered on, a Coulomb force is generated between the charged columnar structure in the touch substrate and the pixel electrode in the array substrate on the basis of the Coulomb force principle. Under the action of the Coulomb force, the flexible film layer in the touch substrate is deformed so that a surface of the touch substrate becomes uneven to form corresponding braille, and in turn, blind persons are allowed to read by touching the display device for the blind. After the pixel electrode on the array substrate is powered off in a state of being powered on, the deformed flexible film layer is restored by the elastic film layer to a non-deformation state, and then, a region on the touch substrate corresponding to the powered-off pixel electrode is restored to a state where the pixel electrode is not powered on. In this way, an object that blind persons are allowed to read by touching a display panel for the blind is achieved by the display panel for the blind provided by the embodiments of the invention, and a problem in prior art that the blind persons can not read electronic books is solved.

Figure 5:
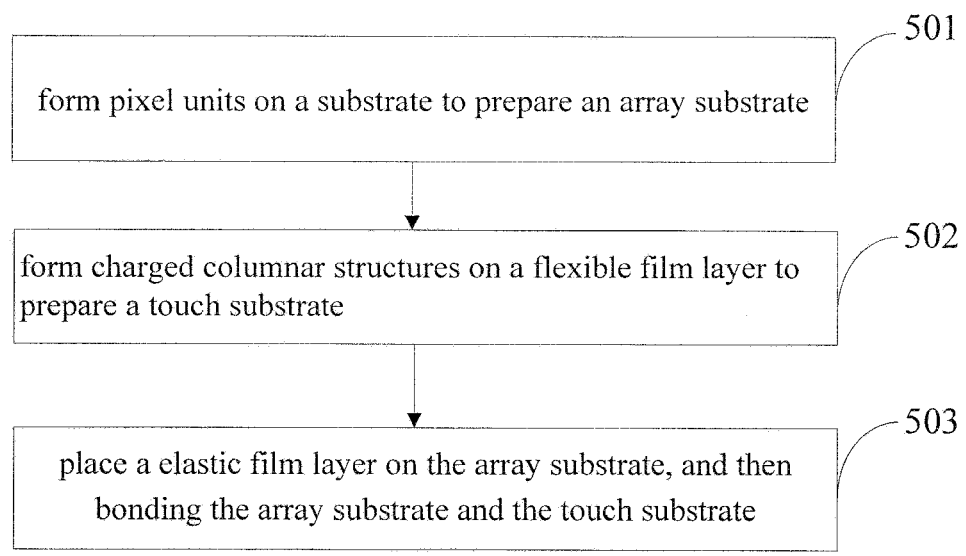
FIG. 5 is a flowchart illustrating a method for manufacturing a display panel for the blind provided by another embodiment of the invention.

In the following, a method for manufacturing a display panel for the blind provided by another embodiment of the invention will be described with reference to FIG. 5. FIG. 5 is a flowchart illustrating the method of manufacturing the display panel for the blind provided by another embodiment of the invention. As shown in FIG. 5, the method for manufacturing the display panel for the blind provided by another embodiment of the invention comprises:

Step 501, a plurality of data lines and a plurality of gate lines are formed on a glass substrate, the data lines and the gate lines intersect each other to form a plurality of pixel units, and each of the pixel units may include a thin film transistor and a pixel electrode, to thereby form an array substrate.

In this embodiment, the step 501 can be performed in the same way as the steps 3011-3014 included in the step 301 in the above embodiment, and details are omitted here.

Step 502, a spacer layer is formed (for example, deposited) on a flexible film layer, and is subjected to a patterning process to form charged columnar structures, so that a touch substrate is formed. In this embodiment, the spacer layer is formed of a resin material in which charged grains are uniformly distributed.

Step 503, an elastic film layer is placed on the array substrate, and the array substrate and the touch substrate are bonded, so that the elastic film layer is disposed between the array substrate and the touch substrate, wherein a side of the touch substrate on which the charged columnar structures are formed faces a side of the array substrate on which the pixel electrodes are formed, and the charged columnar structures on the touch substrate correspond to the pixel electrodes on the array substrate one to one.

In the method for manufacturing the display panel for the blind provided by the embodiment of the invention, in order to make sure that the touch substrate is deformed only depending on a voltage applied to the pixel electrodes on the array substrate after the touch substrate and the array substrate are bonded, prior to deposition of the spacer layer on the flexible film layer, the method can further include: a flexible conductive film layer is deposited on the flexible film layer, and as such, it is possible to shield an external electric field.

In the method for manufacturing the display panel for the blind provided by the embodiment of the invention, in order to assure flatness of the array substrate, the method can further include: a planarizing layer for a planarization function is deposited on the glass substrate having the pixel units formed thereon.

According to the method for manufacturing the display panel for the blind provided by the embodiment of the invention, the manufactured display panel for the blind comprises the array substrate and the touch substrate provided on the array substrate, and thus, after the pixel electrode on the array substrate is powered on, a Coulomb force is generated between the charged columnar structure in the touch substrate and the pixel electrode in the array substrate on the basis of the Coulomb force principle. Under the action of the Coulomb force, the flexible film layer in the touch substrate is deformed so that a surface of the touch substrate becomes uneven to form corresponding braille, and in turn, blind persons are allowed to read by touching the display device for the blind. After the pixel electrode on the array substrate is powered off in a state of being powered on, the deformed flexible film layer is restored by the elastic film layer to a non-deformation state, and then, a region on the touch substrate corresponding to the powered-off pixel electrode is restored to a state where the pixel electrode is not powered on. In this way, an object that blind persons are allowed to read by touching a display panel for the blind is achieved by the display panel for the blind provided by the embodiments of the invention, and a problem in prior art that the blind persons can not read electronic books is solved.

The display panel for the blind and the method for manufacturing the same provided by embodiments of the invention can be applied in a display device suitable for blind persons.

It should be noted that, the patterning process described in the embodiments of the invention may comprises coating a photoresist, masking, exposing, developing, etching, removing of the photoresist and the other processes, and a positive photoresist is taken as an example of the photoresist, but the invention is not limited thereto.

At l021, it should be noted that, the forgoing embodiments are merely used to explain the technical solutions of the invention, but not limitations on them. Although the invention is described in detail with reference to the above embodiments, as would be appreciated by those ordinarily skilled in the art, they can make modifications to the technical solutions recorded by the above embodiments or make equivalent replacements to a part of technical features therein; and these modifications or replacements do not make the essence of a corresponding technical solution departing from the spirit and scope of the present disclosure.

The invention claimed is:

1. A display panel for the blind, comprising:
an array substrate, including a glass substrate and data lines and gate lines formed on the glass substrate, the data lines and gate lines intersecting each other so as to form pixel units, each of the pixel units including a pixel electrode;
a touch substrate, including a flexible film layer and charged columnar structures provided on the flexible film layer; and
an elastic film layer, provided between the array substrate and the touch substrate,
wherein a side of the touch substrate on which the charged columnar structures are formed faces a side of the array substrate on which the pixel electrodes are formed, and the charged columnar structures on the touch substrate correspond to the pixel electrodes on the array substrate one to one.

2. The display panel for the blind according to claim 1, wherein, the elastic film layer is formed on the array substrate.

3. The display panel for the blind according to claim 1, wherein, the elastic film layer is placed on the array substrate.

4. The display panel for the blind according to claim 1, further comprising a planarizing layer formed on the array substrate, the planarizing layer being disposed between the array substrate and the elastic film layer.

5. The display panel for the blind according to claim 1, wherein, the touch substrate further comprises a flexible conductive film layer, and the flexible conductive film layer is provided between the flexible film layer and the charged columnar structures.

6. The display panel for the blind according to claim 1, wherein, the charged columnar structures are formed from a resin material in which charged grains are uniformly distributed.

7. A display device for the blind, which comprises a display panel for the blind, the display panel for the blind comprising:
an array substrate, including a glass substrate and data lines and gate lines formed on the glass substrate, the data lines and gate lines intersecting each other so as to form pixel units, each of the pixel units including a pixel electrode;
a touch substrate, including a flexible film layer and charged columnar structures provided on the flexible film layer; and
an elastic film layer, provided between the array substrate and the touch substrate,
wherein a side of the touch substrate on which the charged columnar structures are formed faces a side of the array substrate on which the pixel electrodes are formed, and the charged columnar structures on the touch substrate correspond to the pixel electrodes on the array substrate one to one.

8. The display device for the blind according to claim 7, wherein, the elastic film layer is formed on the array substrate.

9. The display device for the blind according to claim 7, wherein, the elastic film layer is placed on the array substrate.

10. The display device for the blind according to claim 7, further comprising a planarizing layer formed on the array substrate, the planarizing layer being disposed between the array substrate and the elastic film layer.

11. The display device for the blind according to claim 7, wherein, the touch substrate further comprises a flexible conductive film layer and the flexible conductive film layer is provided between the flexible film layer and the charged columnar structures.

12. The display device for the blind according to claim 7, wherein, the charged columnar structures are formed from a resin material in which charged grains are uniformly distributed.

* * * * *